United States Patent

Nagahashi

(10) Patent No.: US 9,385,440 B2
(45) Date of Patent: Jul. 5, 2016

(54) CYLINDRICAL BRAID CRIMP CONNECTION STRUCTURE

(71) Applicant: YAZAKI CORPORATION, Tokyo (JP)

(72) Inventor: Mitsuharu Nagahashi, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/400,847

(22) PCT Filed: Apr. 9, 2013

(86) PCT No.: PCT/JP2013/062313
§ 371 (c)(1),
(2) Date: Nov. 13, 2014

(87) PCT Pub. No.: WO2013/172178
PCT Pub. Date: Nov. 21, 2013

(65) Prior Publication Data
US 2015/0155638 A1    Jun. 4, 2015

(30) Foreign Application Priority Data

May 14, 2012  (JP) ................. 2012-110180

(51) Int. Cl.
*H01R 4/00* (2006.01)
*H01R 4/20* (2006.01)
(Continued)

(52) U.S. Cl.
CPC ............ *H01R 4/203* (2013.01); *H01R 9/03* (2013.01); *H05K 9/0018* (2013.01); *H01R 9/032* (2013.01); *H01R 2103/00* (2013.01)

(58) Field of Classification Search
CPC .......................... H01R 4/20; H01R 4/203
USPC .............. 174/74 R, 77 R, 78, 79, 74 A
See application file for complete search history.

(56) References Cited

U.S. PATENT DOCUMENTS 3,546,365 A * 12/1970 Collier ................. H01R 4/188
174/75 C
3,897,129 A * 7/1975 Farrar, Jr. .............. H02G 15/10
174/138 F (Continued)

FOREIGN PATENT DOCUMENTS

CN         1638195 A      7/2005
JP     2003-115223 A  *  4/2003 ............ H01B 7/17

(Continued)

OTHER PUBLICATIONS

International Search Report dated Aug. 6, 2013 issued in International Application No. PCT/JP2013/062313 (PCT/ISA/210).

(Continued)

*Primary Examiner* — William H Mayo, III
(74) *Attorney, Agent, or Firm* — Sughrue Mion, PLLC

(57) ABSTRACT

A cylindrical braid crimp connection structure includes a cylindrical braid formed by braiding bundles of wires, a cylindrical connection portion inserted inside of a terminal of the cylindrical braid, and a ring crimp member fitted on an outside of the terminal of the cylindrical braid. The ring crimp member is crimped to form recessed deformities, and the terminal is pressed toward the cylindrical connection portion by the recessed deformities to complete an electric connection. The recessed deformities are formed with a shape larger than the meshes formed in the cylindrical braid.

2 Claims, 4 Drawing Sheets

(51) Int. Cl.
*H05K 9/00* (2006.01)
*H01R 9/03* (2006.01)
*H01R 103/00* (2006.01)

(56) References Cited

U.S. PATENT DOCUMENTS

| | | | | | |
|---|---|---|---|---|---|
| 4,025,145 | A | * | 5/1977 | Shaffer | H01R 9/032 29/857 |
| 4,830,629 | A | * | 5/1989 | Yoshimura | H01R 13/6593 439/456 |
| 5,051,543 | A | * | 9/1991 | McGuire | H01R 4/203 16/108 |
| 6,583,352 | B2 | * | 6/2003 | Fukushima | H01R 9/032 174/373 |
| 6,864,426 | B2 | * | 3/2005 | Miyazaki | H01R 13/655 174/75 C |
| 7,666,032 | B2 | * | 2/2010 | Aoki | H01R 9/032 29/844 |
| 9,112,287 | B2 | * | 8/2015 | Toyama | H01R 4/182 |
| 2003/0221850 | A1 | * | 12/2003 | Mizutani | H01R 13/6592 174/36 |
| 2004/0099428 | A1 | | 5/2004 | Miyazaki | |
| 2004/0144557 | A1 | * | 7/2004 | Miyazaki | H01R 13/6592 174/72 A |
| 2009/0098779 | A1 | * | 4/2009 | Kawamura | H01R 9/032 439/733.1 |
| 2012/0312597 | A1 | * | 12/2012 | Toyama | H01R 4/182 174/84 C |

FOREIGN PATENT DOCUMENTS

| | | | | |
|---|---|---|---|---|
| JP | 2003-264040 A | | 9/2003 | |
| JP | 2005-339933 A | * | 5/2004 | H01R 13/655 |
| JP | 2005-149963 A | * | 6/2005 | H01B 7/17 |
| JP | 2005197159 A | | 7/2005 | |
| JP | 2010-140757 A | | 6/2010 | |
| JP | 2010272301 | | 12/2010 | |
| JP | 2011-165355 A | | 8/2011 | |
| JP | WO2011/096425 A1 | * | 8/2011 | H01R 4/18 |
| WO | 2011/096425 A1 | | 8/2011 | |

OTHER PUBLICATIONS

Written Opinion dated Aug. 6, 2013 issued in International Application No. PCT/JP2013/062313 (PCT/ISA/237).
Office Action with Search Report dated Dec. 4, 2015, issued by the State Intellectual Property Office of P.R. China in counterpart Chinese Application No. 201380025144.6.
Office Action dated Dec. 10, 2015, issued by the European Patent Office in counterpart European Application No. 13723260.9.
Communication from the Korean Intellectual Property Office dated Nov. 2, 2015 in a counterpart Korean application No. 10-2014-7031977.
Communication from the Australian Patent Office issued Oct. 28, 2015 in a counterpart Australian Application No. 2013260799.
Communication from the Japanese Patent Office dated Oct. 20, 2015 in a counterpart Japanese application No. 2012-110180.
Communication dated Jan. 5, 2016 issued by Japanese Intellectual Property Office in counterpart Japanese Patent Application No. 2012-110180.

* cited by examiner

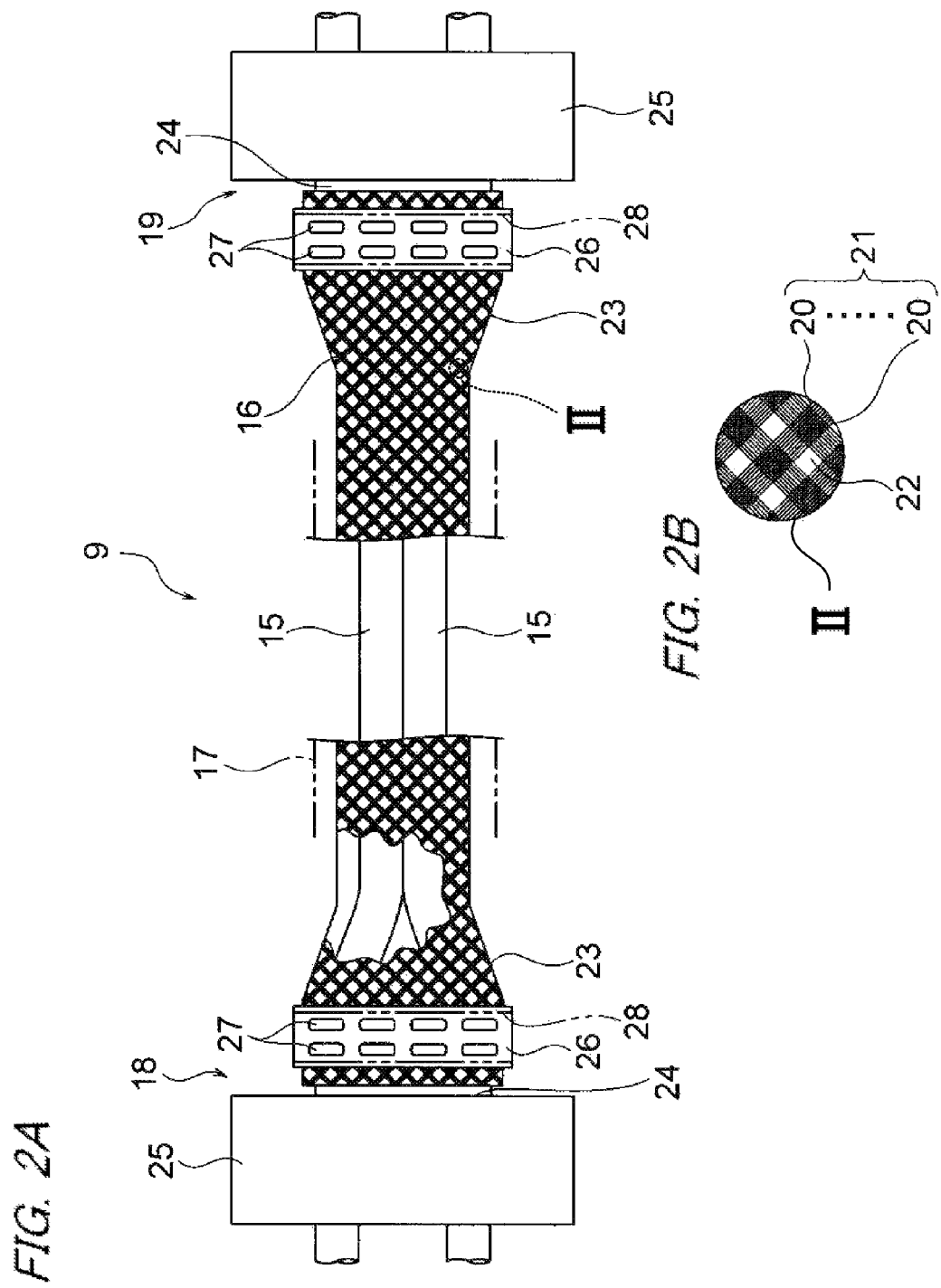

CYLINDRICAL BRAID CRIMP CONNECTION STRUCTURE

TECHNICAL FIELD

The present invention relates to a cylindrical braid crimp connection structure that crimps a rink crimp member, and electrically connects a cylindrical braid to a cylindrical connection portion.

BACKGROUND ART

For example, a battery and an inverter unit in a hybrid vehicle or an electric vehicle are electrically connected to each other by a high-voltage wire harness. The wire harness includes a high-voltage electric power line of a high-voltage electrically conducting path, and a shield member that covers the high-voltage electrical power line. The shield member is formed of a cylindrical braid.

Patent Literature 1 discloses a structure in which an end portion of the cylindrical braid is electrically connected. Specifically, Patent Literature 1 discloses a structure in which an end of the cylindrical braid arranged outside of an electric wire and a cylindrical shield shell are crimped to the ring crimp member for electric connection. In Patent Literature 1, the cylindrical braid is cylindrically formed by braiding ultrafine wires having an electric conductivity. Also, the shield shell has an electrical conductivity and is shaped so that the cylindrical braid terminal can be connected on an outer peripheral surface thereof. Also, the ring crimp member is so shaped as to be crimped by a crimp die after the cylindrical braid has been inserted into an inside thereof. When the ring crimp member is crimped, the cylindrical braid is brought into contact with the shield shell to complete an electric connection.

CITATION LIST

Patent Literature

[PTL 1] Japanese Patent Publication No. JP-A-2003-264040

SUMMARY OF INVENTION

Technical Problem

In the cylindrical braid in the above related art, for example, 300 wires are used. The wires are made of copper, and, for example, subjected to tinning. When the cylindrical braid formed of 300 copper wires is formed with a length corresponding to a distance from a battery to an inverter unit, a resultant member becomes relatively heavy.

In recent automobile parts, since a demand rises for lightweight, it is conceivable that the wires are made of aluminum or aluminum alloy for lightweight.

However, the present inventors have found out that even though a material of the wires is merely changed to aluminum or aluminum alloy, an excellent connection is not obtained unlike copper, and if the excellent connection is not obtained, a sufficient shield effect cannot be also ensured. Then, as its countermeasure, it is conceivable that a connection structure of the cylindrical brain terminal and the shield shell is reviewed so that the wires can be more surely brought into contact with each other.

The cylindrical braid is formed by braiding bundles of wires, and since a large number of meshes is provided, if the cylindrical braid terminal is widened, the meshes are naturally enlarged, and the wire contact effective for the electric connection may become unstable. Also, when the material in the cylindrical braid is changed from copper to aluminum or aluminum alloy, there is a concern about an influence of an oxide film. Accordingly, a review for obtaining an excellent contact of the wires (the bundles of wires) is important.

The present invention has been made under the above-mentioned circumstances, and therefore an object of the present invention is to provide a cylindrical braid crimp connection structure that can improve the contact of wires to ensure a sufficient shield effect in reducing the weight of the cylindrical braid.

Solution To Problem

According to one aspect of the present invention, there is provided a cylindrical braid crimp connection structure comprising: a cylindrical braid that covers one or a plurality of electrically conducting paths; a cylindrical connection portion having an electrical conductivity and made of metal which is inserted inside of a terminal of the cylindrical braid; and a ring crimp member made of metal which is deformable by crimping and fitted on an outside of the terminal of the cylindrical braid in which the cylindrical braid and the cylindrical connection portion are electrically connected to each other by crimping the ring crimp member, wherein the cylindrical braid is formed by braiding bundles of wires made of aluminum or aluminum alloy, a plurality of recessed deformities which is recessed toward the cylindrical braid side by the crimping is formed in the ring crimp member, and the recessed deformities are shaped to be larger than the meshes formed in the cylindrical braid.

The ring crimp member may be formed with additional recessed deformities which are recessed shallower than the recessed deformities and press the terminal of the cylindrical braid weaker than the recessed deformities.

According to the present invention having the above feature, when the ring crimp member is crimped, a recessed deformity is formed in the ring crimp member. The cylindrical braid is pressed by formation of the recessed deformity and contacts with the cylindrical connection portion, to thereby complete an electric connection.

According to the present invention, there is provided a structure in which not only the material of the cylindrical braided wire is merely changed to aluminum or aluminum alloy, but also the recessed deformity is formed in the ring crimp member, and pressed against the cylindrical connection portion.

Accordingly, the wires can be more surely brought into contact with each other while the lightweight is kept.

Since the cylindrical braid is formed by braiding the bundles of wires, if the recessed deformity is shaped to be larger than the meshes of the cylindrical braid, the cylindrical braid can be surely brought into contact with the cylindrical connection portion.

The recessed deformity causes a friction of the respective wires when pressing the bundles of wires to destroy the oxide film, thereby enabling the electric connection to be improved.

It is effective that the ring crimp member can press the terminal of the cylindrical braid with the use of not only the recessed deformity but also the periphery thereof.

Advantageous Effects Of Invention

According to the present invention, since the recessed deformity shaped to be larger than the meshes of the cylindrical braid is formed by crimping, the bundles of wires (wires) can be surely pressed against the cylindrical connection portion with the results that the contact of the wires can be improved. Also, the contact of the wires can be improved with the effect that the sufficient shield effect can be also ensured. Therefore, according to the present invention, the wires of the cylindrical braid can be made of aluminum or aluminum alloy with the results that the cylindrical braid can be reduced in weight.

BRIEF DESCRIPTION OF DRAWINGS

FIGS. 2A and 2B are configuration diagrams of a wire harness including a cylindrical braid crimp connection structure according to the present invention.

DESCRIPTION OF EMBODIMENTS

Figure 1:
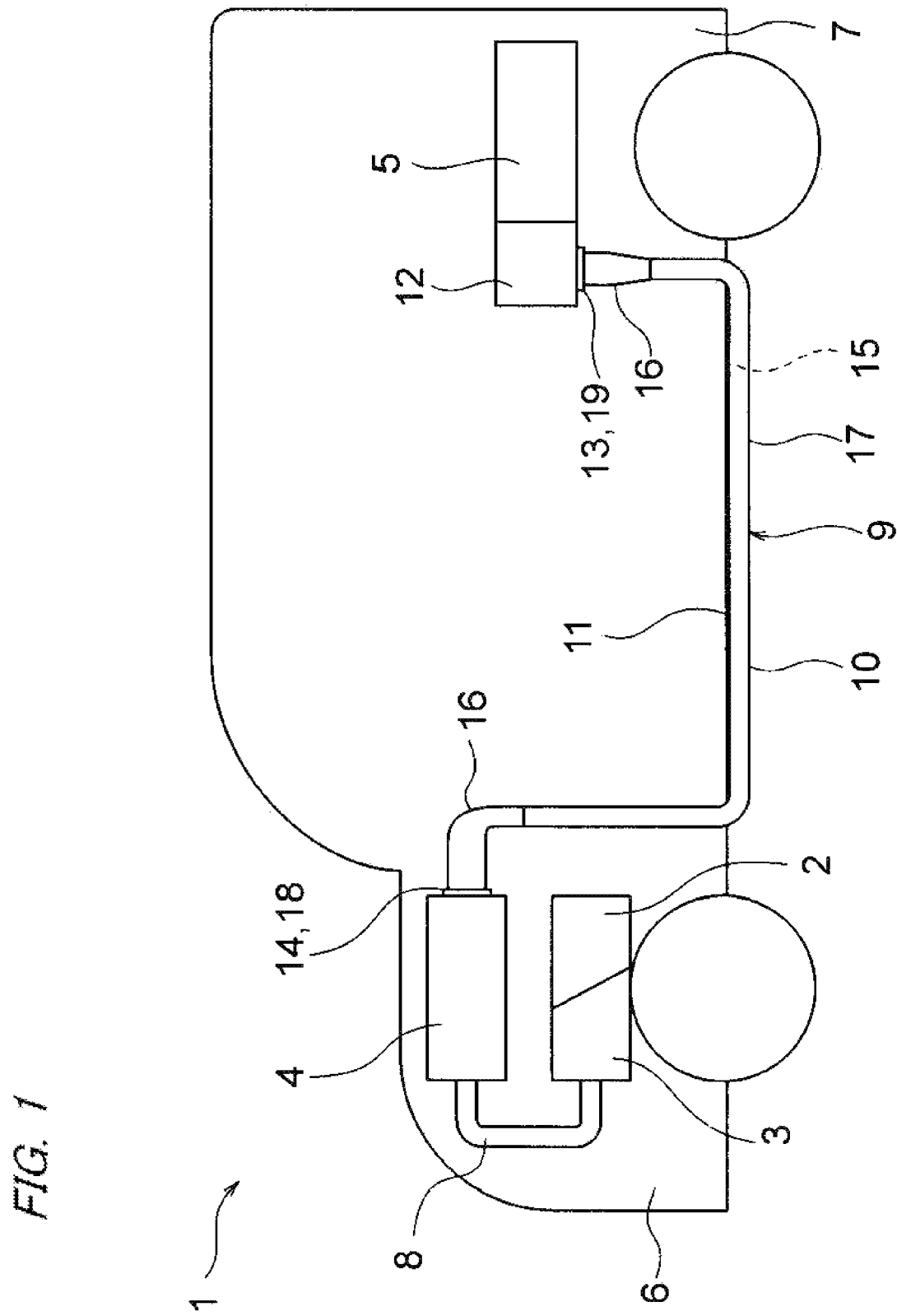
FIG. 1 is a schematic diagram of an automobile.

Hereinafter, an embodiment will be described with reference to the accompanying drawings. FIG. 1 is a schematic diagram of an automobile. Also, FIG. 2A is a configuration diagram of a wire harness including a cylindrical braid crimp connection structure according to the present invention, and FIG. 2B is an enlarged view of an encircled part II of FIG. 2A. Further, FIGS. 3A to 3G are diagrams each illustrating a variation example of a recessed deformity, and FIG. 4 is a perspective view illustrating the cylindrical braid crimp connection structure.

In this embodiment, the present invention is applied to a wire harness routed in a hybrid vehicle (or an electric vehicle or a general vehicle).

Referring to FIG. 1, reference numeral 1 denotes a hybrid vehicle. The hybrid vehicle 1 is a vehicle that drives two powers of an engine 2 and a motor unit 3 in mixture, and an electric power is supplied to a motor unit 3 from a battery 5 (battery pack) through an inverter unit 4. The engine 2, the motor unit 3, and the inverter unit 4 are mounted in an engine room 6 present at a position of front wheels in this embodiment. Also, the battery 5 is mounted in a vehicle rear portion 7 present at a position of rear wheels (may be mounted within a vehicle interior present in the rear of the engine room 6).

The motor unit 3 and the inverter unit 4 are connected by a high-voltage wire harness 8. Also, the battery 5 and the inverter unit 4 are connected by a high-voltage wire harness 9. The wire harness 9 has an intermediate portion 10 routed on a ground side of a chassis underfloor 11. Also, the wire harness 9 is routed substantially in parallel along the chassis underfloor 11. The chassis underfloor 11 is configured by a known body which is a so-called panel member in which a through-hole (reference symbol omitted) is formed at a given position. The wire harness 9 is inserted through the through-hole.

The wire harness 9 and the battery 5 are connected to each other through a junction block 12 disposed on the battery 5. The junction block 12 is electrically connected with a rear end 13 of the wire harness 9 through a known method. A front end 14 side of the wire harness 9 is electrically connected to the inverter unit 4 by a known method.

The motor unit 3 includes a motor and a generator. Also, the inverter unit 4 includes an inverter and a converter. The motor unit 3 is formed as a motor assembly including a shield case. The inverter unit 4 is also formed as an inverter assembly including the shield case. The battery 5 is of a Ni-MH type or an Li-ion type, and configured by a module. For example, an electric storage device such as a capacitor can be used. The battery 5 is not particularly restricted if the battery 1 can be used for the hybrid vehicle 1 or the electric vehicle.

First, a configuration and a structure of the wire harness 9 will be described. The wire harness 9 is a high-voltage member for electrically connecting the inverter unit 4 and the battery 5 as described above. The wire harness 9 includes one or a plurality of electrically conducting paths 15, a cylindrical braid 16, an armoring material 17, an inverter side connection portion 18, and a battery side connection portion 19.

Referring to FIG. 2A, as the electrically conducting path 15, there is applied a high-voltage electrical power line including a conductor or an insulator, a cabtire cable, or a high-voltage coaxial composite electrically conducting path singly having a plus circuit and a minus circuit. In this embodiment, a known high-voltage electrical power line is applied as the electrically conducting paths 15 (refer to FIG. 2A).

The cylindrical braid 16 is formed by braiding bundles 21 of ultrafine metal wires 20 (wires) having conductivity into a cylindrical shape, and a large number of meshes 22 is formed. The number of metal wires in each bundle, and the number of bundles are arbitrary in braiding. The metal wires 20 is made of aluminum or aluminum alloy for the purpose of reducing the weight.

The cylindrical braid 16 is formed longwise in advance, and thereafter cut into given-length pieces. A terminal 23 of the cylindrical braid 16 may be maintained in the cut state as it is, or may be folded back toward the inside into at least a double state. Alternatively, the terminal 23 may be subjected to given terminal processing (the same processing as that of the braid made of copper).

The electrically conducting paths 15 are inserted inside of the cylindrical braid 16 in a lump. The terminal 23 of the cylindrical braid 16 is enlarged according to shapes of the inverter side connection portion 18 and the battery side connection portion 19. The meshes 22 of the cylindrical braid 16 are also enlarged according to the enlargement of the terminal 23.

The armoring material 17 is a protective member disposed outside of the cylindrical braid 16, which is, for example, a pipe made of resin, metal, or rubber, a resin protector, or a wrapped sheet member. The armoring material 17 is not particularly restricted if the armoring material can protect the cylindrical braid 16 and the electrically conducting paths 15. In this embodiment, the armoring material 17 is formed longwise so as to cover a portion other than the terminal 23 of the cylindrical braid 16.

The inverter side connection portion 18 and the battery side connection portion 19 each include a shield shell 25 having a cylindrical connection portion 24, a ring crimp member 26, a terminal fitting (not shown) disposed on terminals of the electrically conducting paths 15, and a bolt (not shown) for fixing the shield shell 25 to the shield case (not shown).

The cylindrical braid crimp connection structure of the present invention is applied to portions in which the inverter side connection portion 18 and the battery side connection portion 19 are provided.

The shield shell 25 is of a metallic structure having the electric conductivity, and has a bolt fixing portion as a portion through which the bolt is inserted although not shown. The shield shell 25 is shaped so that the electrically conducting paths 15 can penetrate through the shield shell 25.

The cylindrical connection portion 24 is arranged in correspondence with a portion through which the electrically conducting paths 15 penetrate. The cylindrical connection portion 24 is a part of the shield shell 25 and made of metal, and annularly formed and inserted inside of the terminal 23 of the cylindrical braid 16. The cylindrical connection portion 24 is an electric connection portion with the terminal 23 of the cylindrical braid 16, and also formed as a support portion when crimping the ring crimp member 26.

The ring crimp member 26 is a member which is fitted on an outside of the terminal 23 of the cylindrical braid 16, and formed by working a deformable thick metal plate into an annular shape. When the ring crimp member 26 is crimped, a plurality of recessed deformities 27 is formed to be recessed toward the cylindrical braid 16 side. In this embodiment, when the ring crimp member 26 is crimped, second recessed deformities 28 are also formed around the plurality of recessed deformities 27.

The above crimp is a work for pressing the ring crimp member 26 from an outside of the ring crimp member 26 by a die as if the diameter of the ring crimp member 26 is reduced, and the terminal 23 of the cylindrical braid 16 is pressed against the cylindrical connection portion 24 so as to be electrically and mechanically fixedly connected to each other.

The recessed deformities 27 are formed as portions in which the bundles 21 of the metal wires 20 configuring the cylindrical braid 16 can be pressed against the cylindrical connection portion 24 strongly and as many as possible. The recessed deformities 27 are formed in shapes larger than the meshes 22 (meshes 22 enlarged in this embodiment) formed in the cylindrical braid 16 for the purpose of pressing the bundles 21 strongly and in large numbers.

If the shape of the recessed deformities 27 is smaller than the meshes 22, the recessed deformities 27 are inserted into the meshes 22, and a pressing force of those portions is weakened. This results in a case in which the excellent connection cannot be ensured. However, in the present invention, since the recessed deformities 27 are shaped to be larger than the meshes 22, the above case is eliminated.

The recessed deformities 27 are shaped so that the respective wires are fractioned with each other to destroy the oxide film when pressing the bundles 21 of the metal wires 20, as a result of which the electric connection can be improved.

Figure 3A:
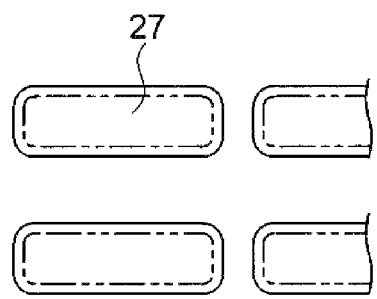
FIGS. 3A to 3G are diagrams each illustrating a variation example of a recessed deformity.
Figure 4:
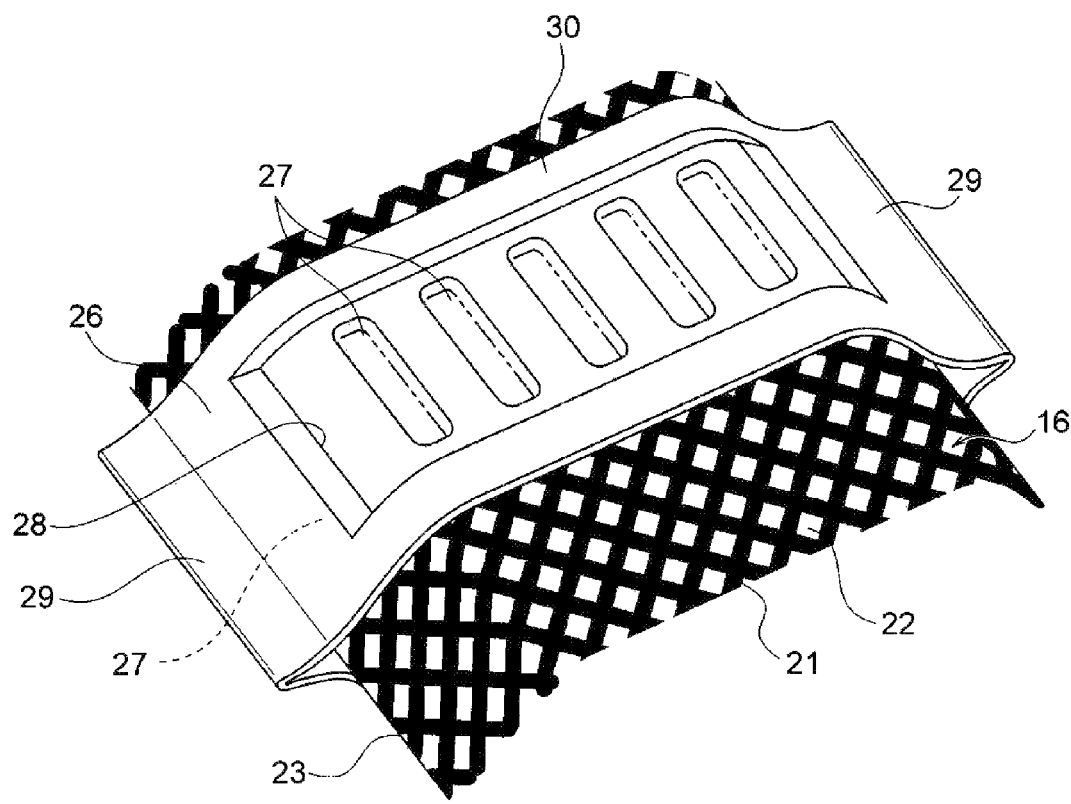
FIG. 4 is a perspective view illustrating the cylindrical braid crimp connection structure.

The recessed deformities 27 are each formed into a substantially rectangular shape, for example, as illustrated in FIGS. 2A and 3A. Also, the recessed deformities 27 are formed to ensure as large numbers as and as large area as possible in a crimp range.

Figure 3B:
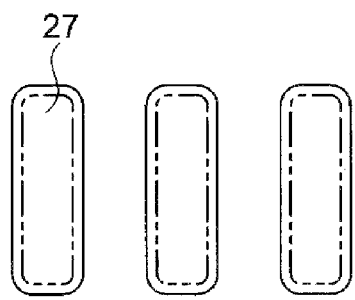
Figure 3C:
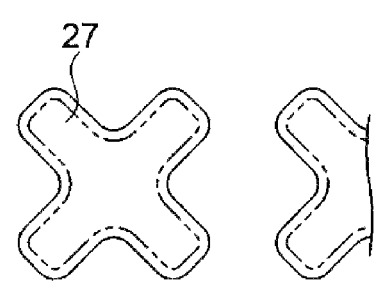
Figure 3D:
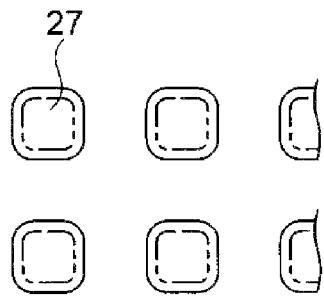
Figure 3E:
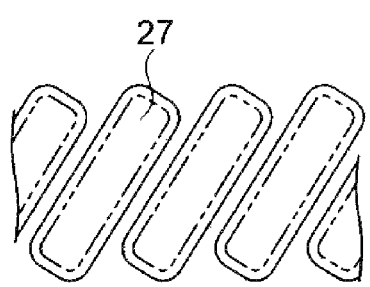
Figure 3F:
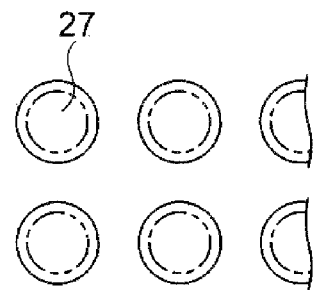
Figure 3G:
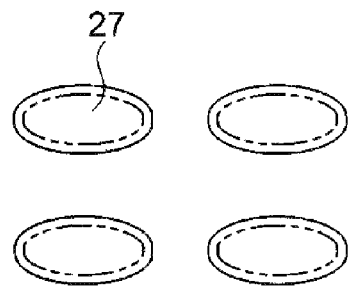

The shape of the recessed deformities 27 may change its orientation by 90 degrees with respect to FIG. 3A as illustrated in FIGS. 3B and 4. Also, the shape of the recessed deformities 27 may extend along extension directions of the bundles 21 (refer to FIGS. 2A and 2B) of the metal wires 20 as illustrated in FIG. 3C. Further, each of the recessed deformities 27 may be of a square dot shape as illustrated in FIG. 3D, a shape in which a substantially rectangular shape is obliquely arranged as illustrated in FIG. 3E, a circular dot shape illustrated in FIG. 3F, or a substantially oval shape as illustrated in FIG. 3G.

Referring to FIGS. 2A and 4, the second recessed deformities 28 are formed as portions which are recessed shallower than the recessed deformities 27, and press the terminal 23 of the cylindrical braid 16. The second recessed deformities 28 are formed as portions which press the terminal 23 of the cylindrical braid 16 weaker than the recessed deformities 27, but stronger than a plate 30 to be described later. The second recessed deformities 28 is arbitrarily formed, but preferably formed for the purpose of performing more excellent electric connection.

A crush portion 29 is formed on both sides of the ring crimp member 26 in association with the crimp. The ring crimp member 26 reduces the diameter as large as the formation of the crush portion 29.

When the ring crimp member 26 reduces the diameter by the crimp, the plate 30 of the ring crimp member 26 pushes an overall periphery of the terminal 23 of the cylindrical braid 16 in a planar fashion. The push of the plate 30 may be soft because of the plane. However, in the present invention, the plurality of recessed deformities 27 is formed, and the sufficient push, that is, contact is ensured.

As described above with reference to FIGS. 1 to 4, according to the present invention, since there is formed the plurality of recessed deformities 27 having the shape larger than the meshes 22 created in the cylindrical braid 16, the bundles 21 of the metal wires 20 can be surely pressed, resulting in such an advantage that the contact of the metal wires 20 can be improved. Also, since the contact of the metal wires 20 can be improved, there is obtained such an advantage that the sufficient shield effect can also been ensured.

Therefore, according to the present invention, the metal wires 20 of the cylindrical braid 16 can be made of aluminum or aluminum alloy with the results that the weight of the cylindrical braid 16 can be reduced.

The present invention can be variously modified without departing from the spirit of the present invention.

The present application is based on Japanese patent application No. 2012-110180 filed on May 14, 2012, and the contents of the patent application are incorporated herein by reference.

INDUSTRIAL APPLICABILITY

The present invention is useful for providing a cylindrical braid crimp connection structure that can improve the contact of wires to ensure a sufficient shield effect in reducing the weight of the cylindrical braid.

REFERENCE SIGNS LIST 1, hybrid vehicle; 2, engine; 3, motor unit; 4, inverter unit, 5, battery, 6, engine room; 7, vehicle rear portion; 8, 9, wire harness; 10, intermediate portion; 11, chassis underfloor; 12, junction block; 13, rear end; 14, front end; 15, electrically conducting path; 16, cylindrical braid; 17, armoring material; 18, inverter side connection portion; 19, battery side connection portion; 20, metal wire (wire); 21, bundle; 22, mesh; 23, terminal; 24, cylindrical connection portion; 25, shield shell; 26, ring crimp member; 27, recessed deformity; 28, second recessed deformity; 29, crush portion; and 30, plate

The invention claimed is:

1. A cylindrical braid crimp connection structure comprising:
   a cylindrical braid that covers at least one electrically conducting path;
   a cylindrical connection portion having an electrical conductivity and made of metal which is inserted inside of a terminal of the cylindrical braid;
   and a ring crimp member made of metal which is deformable by crimping and fitted on an outside of the terminal of the cylindrical braid such that the cylindrical braid and the cylindrical connection portion are electrically connected to each other by crimping the ring crimp member,
   wherein the cylindrical braid is formed by braiding bundles of wires made of aluminum or aluminum alloy, a plurality of recessed deformities which are recessed toward the cylindrical braid side are formed in the ring crimp member by the crimping, and the recessed deformities are shaped to be larger than the meshes formed in the cylindrical braid where the meshes are enlarged by the cylindrical connection portion.

2. The cylindrical braid crimp connection structure as claimed in claim 1,
   wherein the ring crimp member is formed with additional recessed deformities which are recessed shallower than the recessed deformities and press the terminal of the cylindrical braid weaker than the recessed deformities.

\* \* \* \* \*